United States Patent [19]
Jang

[11] Patent Number: 5,910,018
[45] Date of Patent: Jun. 8, 1999

[54] TRENCH EDGE ROUNDING METHOD AND STRUCTURE FOR TRENCH ISOLATION

[75] Inventor: Wen-Yueh Jang, Hsinchu, Taiwan

[73] Assignee: Winbond Electronics Corporation, Taiwan

[21] Appl. No.: 08/803,844

[22] Filed: Feb. 24, 1997

[51] Int. Cl.[6] .................................................. H01L 21/76
[52] U.S. Cl. ..................... 438/425; 438/424; 438/443; 438/426; 438/435; 148/DIG. 50
[58] Field of Search .................................. 438/424, 425, 438/426, 427, 435, 437, 439, 443

[56] References Cited

U.S. PATENT DOCUMENTS

| 5,468,676 | 11/1995 | Madan | 438/426 |
| 5,646,052 | 7/1997 | Lee | 438/426 |
| 5,731,221 | 3/1998 | Kwon | 438/426 |

OTHER PUBLICATIONS

A. Chatter, D. Rogers, J. McKee, I. Ali, S. Nag, and I.C. Chen, *A Shallow Trench Isolation Using LOCOS Edge for Preventing Corner Effects for 0.25/0.8μm CMOS Technologies and Beyond*, IEEE 1996, pp. 829–832.

Primary Examiner—Trung Dang
Attorney, Agent, or Firm—Proskauer Rose LLP

[57] ABSTRACT

The present invention provides a method to achieve shallow trench isolation (STI) on the quarter-micron scale. A thin oxide layer, a thick nitride layer, a thick oxide layer and a thin nitride layer are formed sequentially on a silicon substrate. A photo-resist (PR) layer is then applied as a mask for the isolation regions. The top nitride layer, the top oxide layer and the bottom nitride layer are then etched away from the areas not covered by the PR layer. The PR layer is then removed. An isotropic oxide etch is then applied to create a recess along the bottom oxide layer. A thin oxide layer is then grown on the exposed silicon surface. A thin nitride layer is then deposited to fill the recess in the bottom oxide layer. An anisotropic nitride etch is applied to form a nitride spacer along the isolation edge. A thick oxide layer is then grown and removed. This step is repeated as necessary to obtain the desired trench slope. The silicon substrate is then etched to a predetermined depth using the oxide and nitride layers as a hard mask. The top nitride layer is also etched away. After the trench is etched, the top oxide layer is removed and thermal oxidation is applied. The trench sidewalls are then doped using implantation and/or thermal diffusion to enhance device isolation. The trench is then filled with oxide using a CVD (Chemical Vapor Deposition) process. High temperature annealing is then applied to increase the integrity of the CVD oxide film. The CVD oxide layer is then polished using CMP (Chemical Mechanical Polishing). The nitride layer is then removed. CMP or oxide etchback is then used to planarize the silicon surface.

6 Claims, 4 Drawing Sheets

TRENCH EDGE ROUNDING METHOD AND STRUCTURE FOR TRENCH ISOLATION

FIELD OF THE INVENTION

The present invention relates to semiconductor device fabrication. In particular, the invention relates to a novel method to achieve shallow trench isolation.

BACKGROUND OF THE INVENTION

Semiconductor devices are fabricated with surface conductors for the purpose of distributing operating voltages and currents and digital signals between devices. The surface conductors are insulated from the substrate by a layer of dielectric material. If the dielectric layer is made relatively thick, the effects of capacitive coupling will be lessened. On the other hand, it is desirable to recess the dielectric material and keep the surface of the substrate planar. Therefore, trenches or isolations, are etched into the surface of the substrate and filled with dielectric material such as silicon dioxide. One method used to create these isolations is LOCOS (LOCal Oxidation of Silicon). In this process, grooves are etched into the substrate and using a nitride layer as a mask, selected regions of the silicon substrate are oxidized. However, LOCOS cannot meet the requirements of the quarter-micron design. At this small dimension, there are limitations to LOCOS such as bird's beak formation, insulator thinning, non-planarity and stress-induced silicon defects. Insulator thinning contributes to the non-planarity of the device and reduces isolation depth. Bird's beak encroachment degrades conduction at the trench edges (see A. Bryant, et al., *Characteristics of CMOS Device Isolation for the ULSI Age,* IEDM Technical Digest, P. 671, 1994).

Another method used to create isolations is STI (Shallow Trench Isolation). However, there are limitations with STI as well. When using STI having a vertical trench profile, there are problems with edge conduction, void formation during trench filling, and stress along the trench walls. Edge conduction is more severe the more vertical the trench profile. To reduce this problem, the trench angle should be under 60 degrees. However, this is inadequate for isolation widths below 0.8 $\mu$m. To obtain isolation widths below 0.35 $\mu$m, the trench angle should be greater than 80 degrees (see K. Ishimaru, et al., *Trench Isolation Technology with 1 $\mu$m Depth n- and p-wells for A Full-CMOS SRAM Cell with a 0.4 $\mu$m n+/p+ Spacing,* Symposium on VLSI Technology Digest of Technical Papers, P. 97, 1994). An additional isotropic silicon etch is proposed by Ishimaru to round the trench edges to reduce edge conduction. However, such isotropic silicon etch cannot be easily monitored and controlled. Therefore, device characteristics may be changed from die to die and wafer to wafer.

It is an object of the present invention to provide an improved method for forming shallow trench isolation. Specifically, it is an object of the invention to provide a method for trench edge rounding that is easily monitored and controlled.

SUMMARY OF THE INVENTION

The present invention provides a method to achieve shallow trench isolation (STI) on the quarter-micron scale. A thin oxide layer, a thick $Si_3N_4$ nitride layer, a thick oxide layer and a thin nitride layer are formed sequentially on a silicon substrate. A photo-resist (PR) layer is then applied as a mask for the isolation regions. The top nitride layer and the top oxide layer are then etched away from the areas not covered by the PR layer. The bottom nitride layer is also etched away from the areas not covered by the PR layer. The PR layer is then removed.

The thin oxide layer formed directly on the substrate surface is isotropically etched through the opening formed by etching the other layers. This isotropic etch results in a recess formed underneath the thick nitride layer. A thin oxide layer is then grown on the exposed silicon surface. A thin nitride layer is then deposited to fill the recess in the bottom oxide layer. Subsequently, an anisotropic nitride etch is applied to form a nitride spacer along the isolation edge. A thick oxide layer is then grown and removed. This step is repeated as necessary to obtain the desired trench slope.

The silicon substrate is then etched to a predetermined depth using the oxide and nitride layers as a hard mask. The top nitride layer is also etched away. After the trench is etched, the top oxide layer is removed and thermal oxidation is applied. The trench sidewalls are then doped using implantation and/or thermal diffusion to enhance device isolation.

The trench is then filled with oxide using a CVD (Chemical Vapor Deposition) process. High temperature annealing is then applied to increase the integrity of the CVD oxide film. The CVD oxide layer is then polished using CMP (Chemical Mechanical Polishing) and the nitride layer is removed. CMP or oxide etchback is then used to planarize the silicon surface. Finally, some or all of the oxide on the silicon surface can then be removed.

DETAILED DESCRIPTION OF THE INVENTION

An embodiment of the present invention is discussed in FIGS. 2 through 9. The present invention provides an improved method for trench edge rounding. The invention provides a method for trench edge rounding that is easily monitored and controlled.

Figure 1:
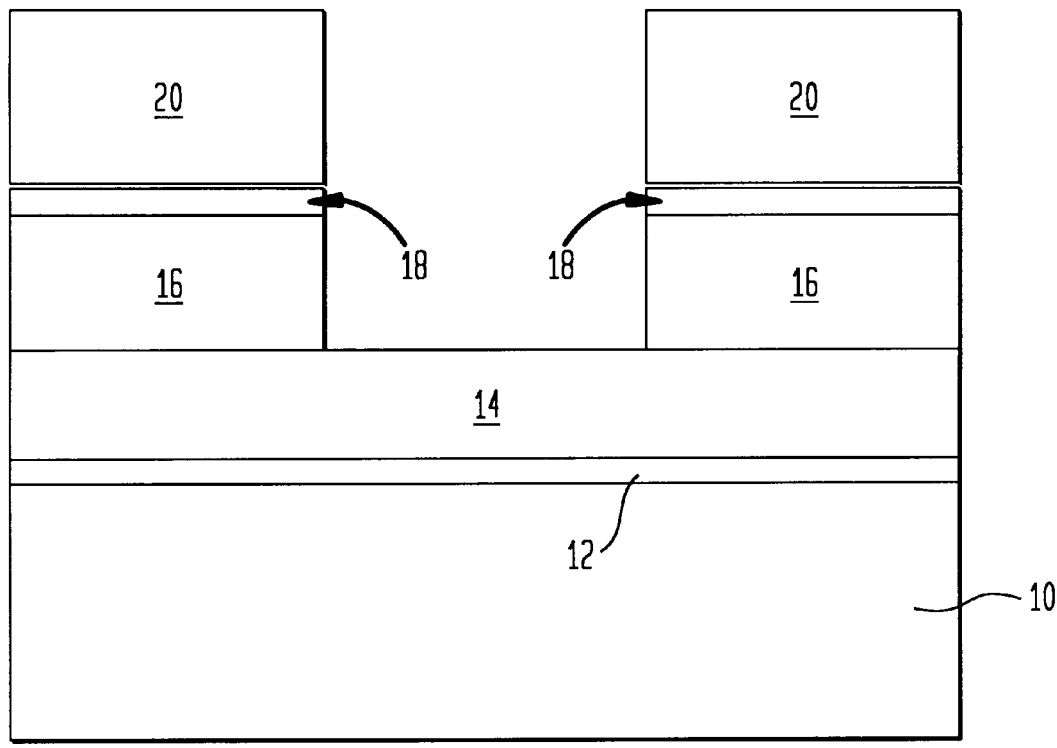
FIGS. 1 through 6 illustrate the formation of a trench isolation region in accordance with an illustrative embodiment of the invention.

As shown in FIG. 1, a first thin oxide layer 12, a first thick $Si_3N_4$ nitride layer 14, a second thick oxide layer 16 and a second thin nitride layer 18 are formed sequentially on the silicon substrate 10. Note that FIG. 1 shows layers 16 and 18 etched through a photo-resist (PR) layer 20, as described below. The first oxide layer 12 has a thickness of approximately 10 nm–40 nm. The first nitride layer 14 has a thickness of approximately 100 nm–400 nm. The second oxide layer 16 has a thickness of approximately 20 nm–200 nm and the second nitride layer 18 has a thickness of approximately 20 nm–100 nm. The PR layer 20 acts as a mask for the isolation regions to be etched, i.e., layers 16 and 18. The second nitride layer 18 is etched using, e.g., $SF_6$ anisotropic nitride etching, while the second oxide layer 16 is etched using, e.g., $CHF_3 + CF_4$ anisotropic oxide etching.

Figure 2:
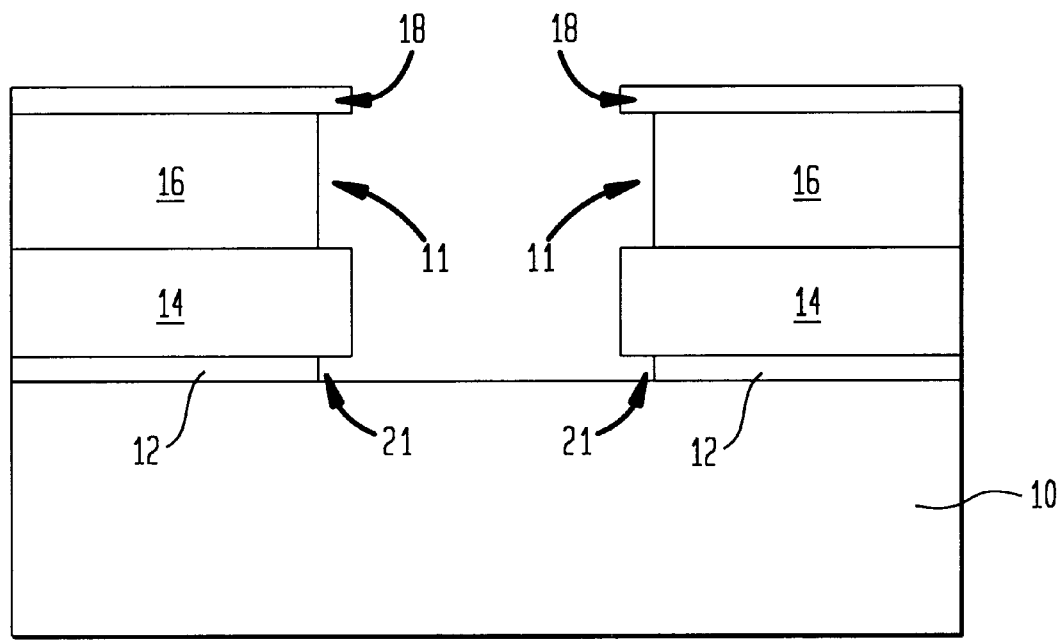

As shown in FIG. 2, the bottom nitride layer 14 is etched using, e.g., $SF_6$ anisotropic nitride etching, with the PR 20 used as a mask. Subsequently, the PR layer 20 is removed. An isotropic oxide etch is applied to the first and second oxide layers 12 and 16 to create recesses 21 and 11 in the first and second oxide layers, respectively. An example of an isotropic oxide etch is a diluted HF (hydrogen fluoride) solution etch. It should be noted that the recesses 11 formed in the second oxide layer are merely ancillary effects of the oxide etch, as the importance of the oxide etch lies in the formation of recesses 21.

Figure 3:
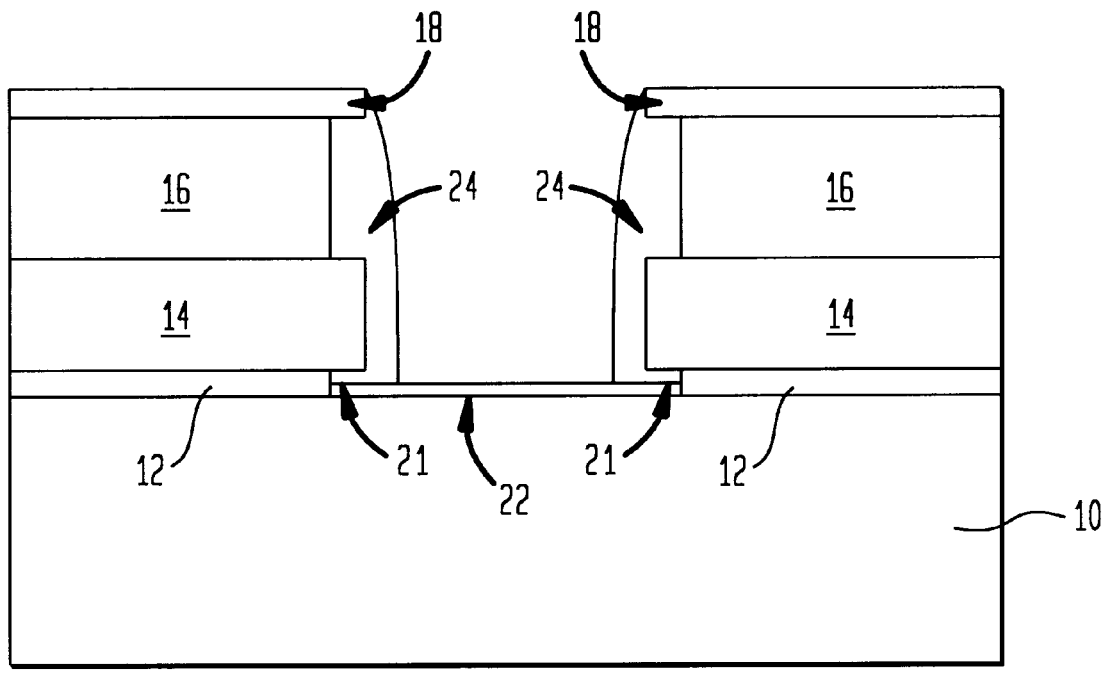

As shown in FIG. 3, an oxide layer 22 is grown on the exposed portions of the silicon surface 10. This oxide layer 22 has a thickness of approximately 5 nm–30 nm. Thereafter, the etched out portions between layers 12, 14, 16, and 18 are filled with a thin nitride layer that is deposited on oxide layer 22 and the isolation edges of layers 12, 14, 16, and 18 (not shown), such that the nitride fills in the oxide recesses 21 of layers 12 and 16. An anisotropic nitride (such as $SF_6$) etch is now applied to the nitride to form a nitride spacer 24 along the isolation edge, as shown.

Figure 4:
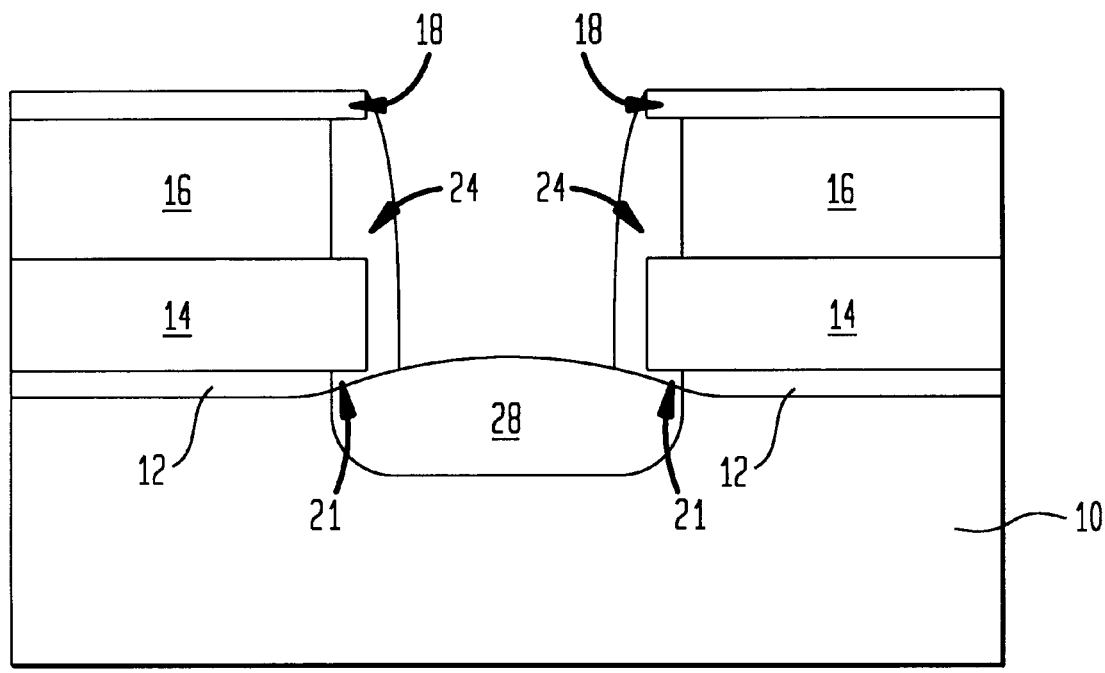

A thick oxide layer 28 is now grown using a thermal oxidation process, as shown in FIG. 4. This oxide layer 28 has a thickness of approximately 20 nm–200 nm. Because the nitride layer 24 fills the recesses 21 in the first oxide layer 12, the lateral oxidation along the bottom oxide 12 is reduced. In other words, the recesses 21 affect the shape and the slope of the bird's beak of oxide 12. Therefore, the length of lateral oxide extrusion (bird's beak) is short and has little effect on the effective diffusion (active) width.

Figure 5:
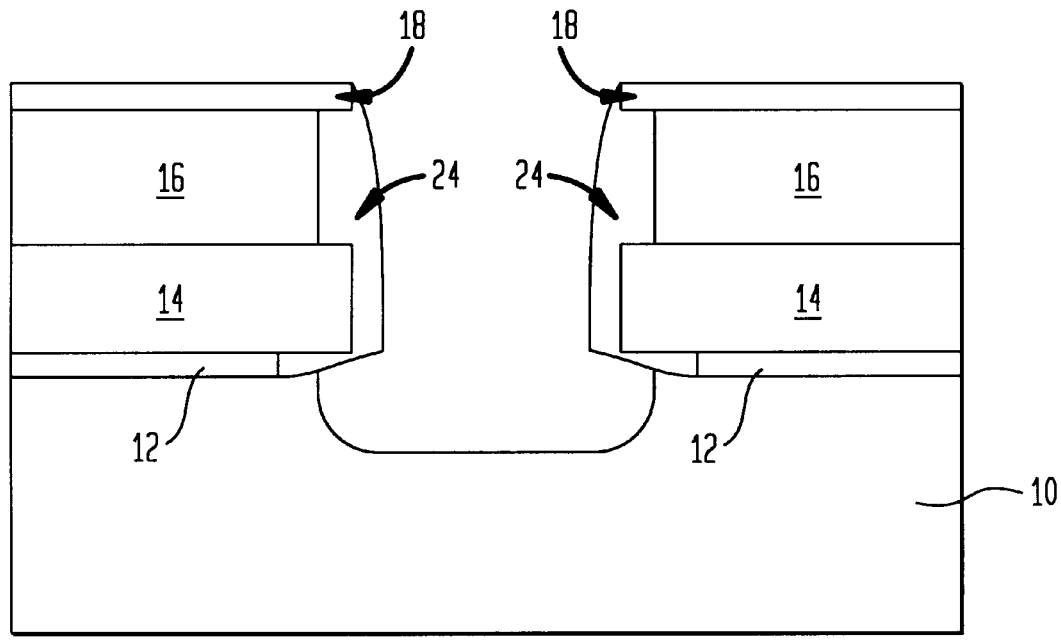

The grown oxide layer 28 is then removed leaving a rounded isolation edge as shown in FIG. 5. Since the trench slope along the isolation edge is determined by the thickness of the grown oxide 28 and the thickness of the oxide 12, nitride 14, and oxide 16 layers, the trench slope is easily monitored and controlled. The steps of growing and removing of the oxide layer 28 are repeated as necessary to obtain the desired trench slope.

Figure 6:
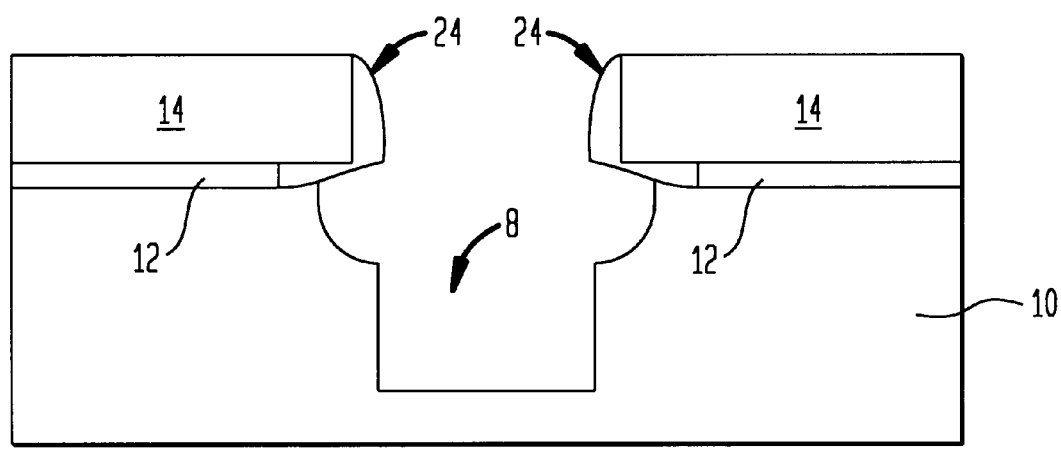

As shown in FIG. 6, a trench 8 is then etched into the silicon substrate 10 to a predetermined depth using the oxide and nitride layers as a hard mask. The etchant is selected not only to etch the silicon substrate 10 to form trench 8, but to simultaneously etch away top nitride layer 18. For example, the etchant used may be $Cl_2+HBr$. The second oxide layer 16 is then removed using, e.g., $CHF_3+CF_4$.

Figure 7:
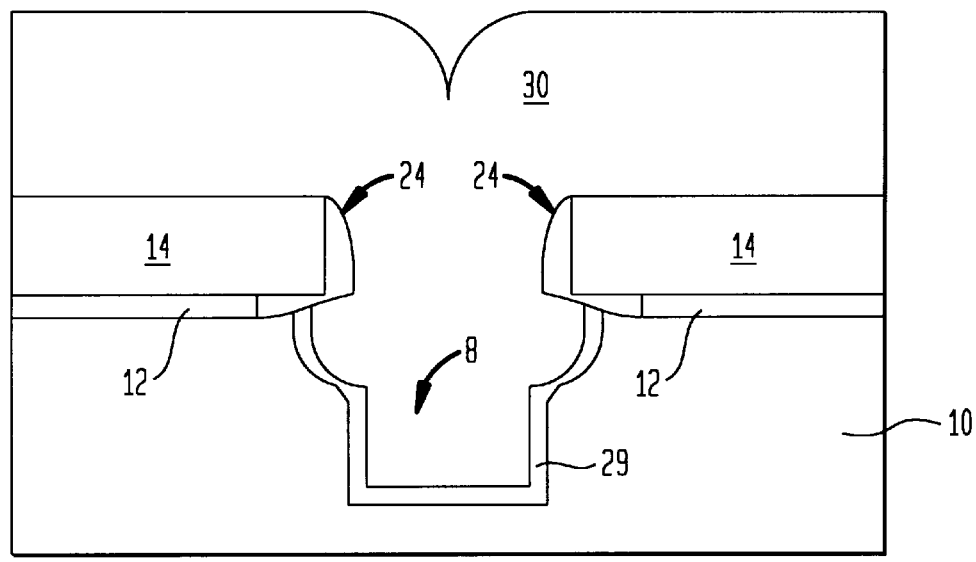
FIGS. 7 through 9 illustrate planarization of the silicon surface in accordance with an illustrative embodiment of the invention.

As shown in FIG. 7, an oxide layer 29 is formed thermally on the sides and bottom of trench 8 to anneal any trench etch damage and to encapsulate any defects that may occur. Such thermal oxidation also provides the advantage of smoothing the transition region between the trench formed by oxide 28 and trench 8. Further, the trench sidewalls are doped using implantation and/or thermal diffusion to enhance device isolation. A CVD (Chemical Vapor Deposition) process is then used to fill the trench with an oxide 30. High temperature annealing is thereafter applied to increase the integrity of the CVD oxide film 30.

Figure 8:
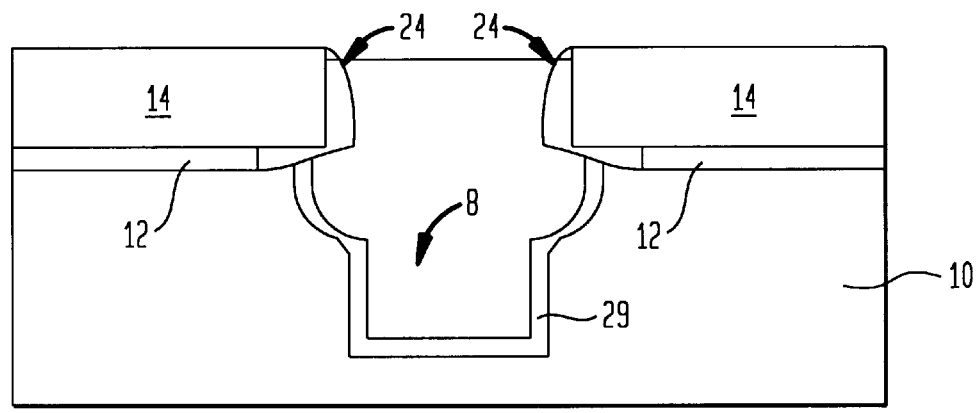
Figure 9:
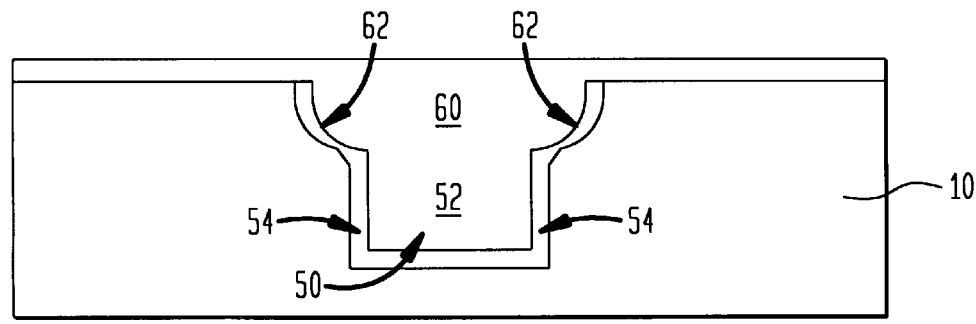

The CVD oxide layer 30 is polished using a CMP (Chemical Mechanical Polishing) process as shown in FIG. 8. During CMP, the nitride layer 14 acts as a polish stop layer. As shown in FIG. 9, the nitride layer 14 is then removed by etching. Next, a second CMP process or an oxide etchback is used to planarize the silicon surface 10. Some or all of the oxide layer 12 on the silicon surface can be removed, as desired.

As further shown in FIG. 9, the silicon substrate 10 has a trench 50. The trench 50 has a lower portion 52 with vertical side walls 54. The lower portion has a width of approximately 0.2 $\mu$m–0.8 $\mu$m and a depth of approximately 0.1 $\mu$m–1.0 $\mu$m. The trench 50 also has an upper portion 60 having rounded edges 62 formed by oxide 28. The upper portion 60 has a width of approximately 0.24 $\mu$m–0.8 $\mu$m and a depth of approximately 0.03 $\mu$m–0.3 $\mu$m. As described above, the trench 50 is filled with dielectric material.

Finally, the above-discussion is intended to be merely illustrative of the invention. Numerous alternative embodiments may be devised by those having ordinary skill in the art without departing from the spirit and scope of the following claims.

I claim:

1. A method for forming a semiconductor structure with a shallow trench comprising the steps of:

forming a first oxide layer, a first nitride layer, a second oxide layer and a second nitride layer sequentially on a silicon substrate of said semiconductor structure, forming a mask with a photo-resist layer on said second nitride layer, etching said second nitride layer, said second oxide layer and said first nitride layer through said mask to expose an isolation edge on either side of the etched area, removing said photo-resist layer, etching said first oxide layer to form recesses, growing a thin third oxide layer on said silicon substrate, depositing a thin nitride layer along said isolation edges including said recesses, such that said thin nitride layer filling at least said recesses, etching said thin nitride layer to form a nitride spacer along said isolation edges, growing a thick oxide layer in said substrate to form curved portions and removing said thick oxide layer, repeating said step of growing and removing said thick oxide layer as necessary to obtain a desired trench slope, etching a trench into said silicon substrate to a predetermined depth using said second oxide layer and said first nitride layer as a mask, said second nitride layer being etched away, said trench having a vertical profile, etching said second oxide layer, and applying thermal oxidation to said semiconductor structure.

2. The method of claim 1, further comprising the step of:
   planarizing the surface of said semiconductor structure.

3. The method of claim 2, further comprising the steps of:
   filling said trench with an oxide,
   polishing said oxide said first nitride layer acting as a polish stop layer, and,
   polishing said semiconductor surface.

4. The method of claim 3, wherein said step of filling said trench utilizes a Chemical Vapor Deposition process.

5. The method of claim 3, wherein said step of polishing said oxide utilizes Chemical Mechanical Polishing.

6. The method of claim 3, wherein said step of polishing said semiconductor surface utilizes a method such as Chemical Mechanical Polishing or oxide etchback.

* * * * *